United States Patent
Izaki

(10) Patent No.: US 6,405,062 B1
(45) Date of Patent: Jun. 11, 2002

(54) BATTERY LEVEL INDICATOR FOR A TELEPHONE SET

(75) Inventor: Masahiro Izaki, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 81 days.

(21) Appl. No.: 09/667,558

(22) Filed: Sep. 22, 2000

(30) Foreign Application Priority Data

Sep. 30, 1999 (JP) .......................................... 11-278642

(51) Int. Cl.[7] ................................................. H04B 1/38
(52) U.S. Cl. ........................ 455/573; 455/572; 455/522; 455/67.1; 455/67.7; 320/132; 324/427
(58) Field of Search ............................... 455/26.1, 67.1, 455/67.7, 522, 573, 574; 343/127; 320/132, 134, 136, 162; 324/433, 427, 435

(56) References Cited

U.S. PATENT DOCUMENTS

| 5,333,176 | A | * | 7/1994 | Burke ........................ 379/58 |
| 6,236,214 | B1 | * | 5/2001 | Camp, Jr. et al. ............ 324/427 |
| 6,263,200 | B1 | * | 7/2001 | Fujimoto .................... 455/343 |

FOREIGN PATENT DOCUMENTS

| JP | 8-180908 | 7/1996 |
| JP | 9-257888 | 10/1997 |
| JP | 9-257889 | 10/1997 |

* cited by examiner

Primary Examiner—William Trost
Assistant Examiner—Danh Le
(74) Attorney, Agent, or Firm—Arent Fox Kintner Plotkin & Kahn, PLLC

(57) ABSTRACT

A battery level indicator is provided in a mobile phone, which is equipped with a communication mode and a standby mode where the current drawn from the battery is different, to display the level of the battery that powers the mobile phone. The battery level indicator includes a battery voltage measuring unit, a correction unit, a level determining unit and a liquid crystal display. The battery voltage measuring unit measures the voltage of the battery at regular intervals, such as every 0.5 seconds. The correcting unit corrects voltage measurements obtained during communication mode by adding correction values specified using a correction value table. The level determining unit calculates an average for voltage measurements, which have been corrected as necessary, produced during a preceding period such as fifteen seconds. This average may be calculated every second, for example. The level determining unit compares the average with a level table that associates voltages during standby mode with notification levels and determines the appropriate notification level. The liquid crystal display displays a symbol that represents the determined notification level.

12 Claims, 7 Drawing Sheets

FIG. 1

| MODE | NOTIFICATION LEVEL | TEMPERATURE-DEPENDENT THRESHOLD VALUES FOR BATTERY VOLTAGE | | | DISPLAY SYMBOL |
|---|---|---|---|---|---|
| | | 6°C OR ABOVE | −10°C OR ABOVE | −11°C OR ABOVE | |
| STANDBY MODE | 5 | 3.78V OR ABOVE | 3.76V OR ABOVE | 3.61V OR ABOVE | |
| | 4 | 3.77V OR BELOW | 3.75V OR BELOW | 3.60V OR BELOW | |
| | 3 | 3.73V OR BELOW | 3.72V OR BELOW | 3.52V OR BELOW | |
| | 2 | 3.69V OR BELOW | 3.66V OR BELOW | 3.41V OR BELOW | |
| | 1 | 3.63V OR BELOW | 3.57V OR BELOW | 3.23V OR BELOW | FLASHING |
| COMMUNICATION MODE | 5 | 3.67V OR ABOVE | 3.59V OR ABOVE | 3.33V OR ABOVE | |
| | 4 | 3.66V OR BELOW | 3.58V OR BELOW | 3.32V OR BELOW | |
| | 3 | 3.61V OR BELOW | 3.50V OR BELOW | 3.26V OR BELOW | |
| | 2 | 3.58V OR BELOW | 3.45V OR BELOW | 3.22V OR BELOW | |
| | 1 | 3.51V OR BELOW | 3.30V OR BELOW | 3.12V OR BELOW | FLASHING |

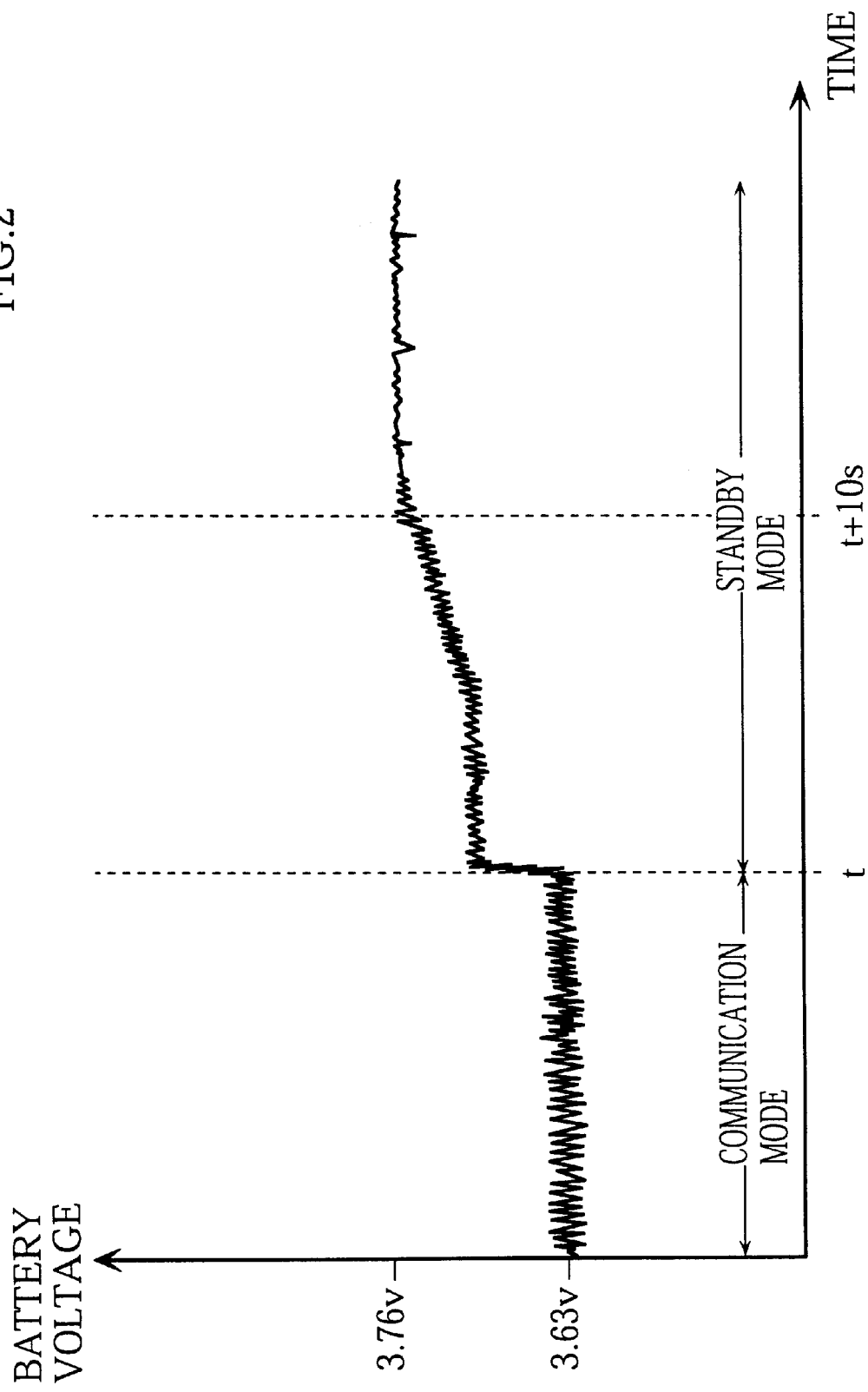

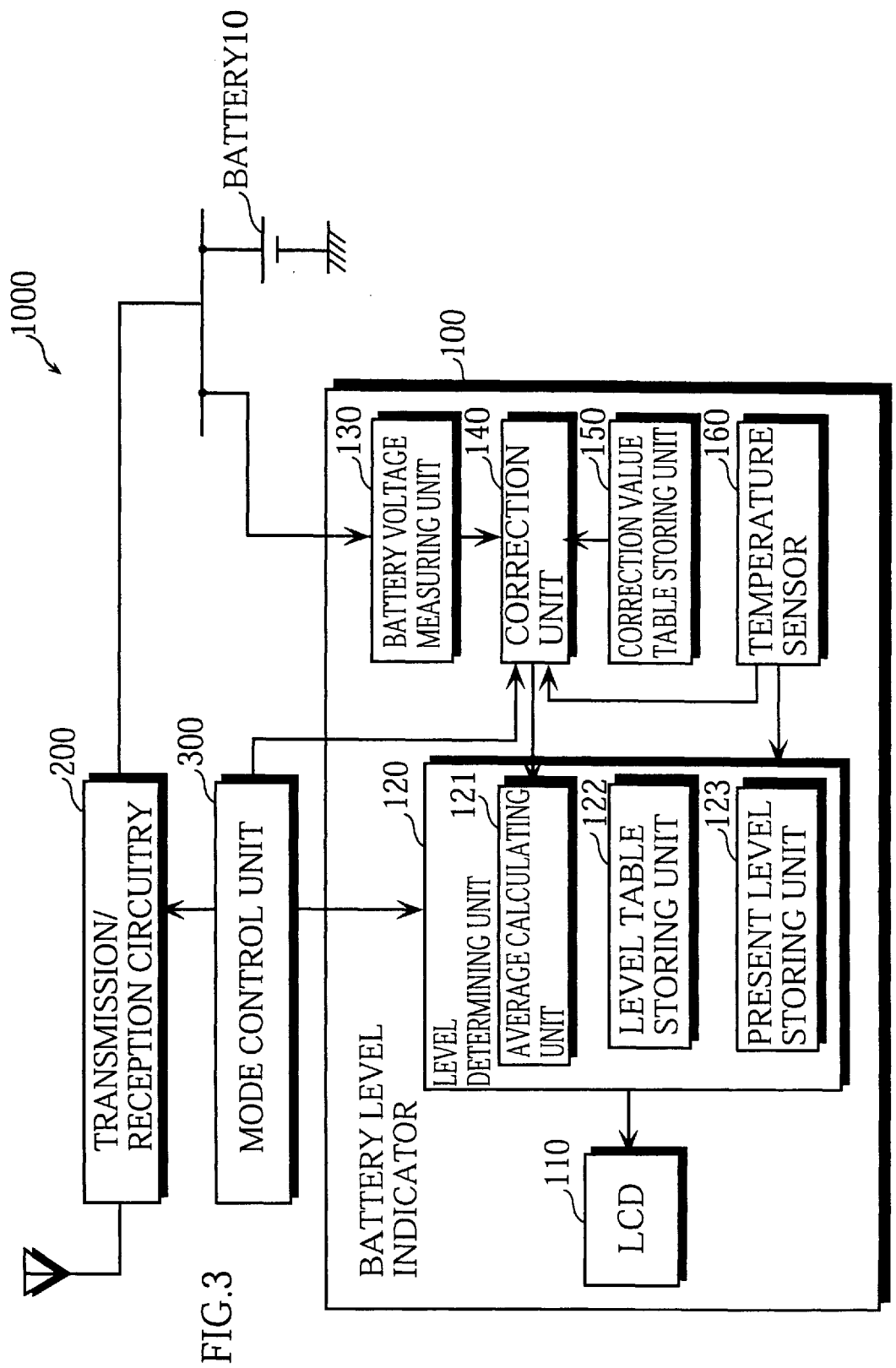

FIG.4

| TEMPERATURE | MEASURED VALUE OF BATTERY VOLTAGE | CORRECTION VALUE |
|---|---|---|
| 6°C OR ABOVE | 3.67V OR ABOVE | 0.11V |
| | 3.62V~3.66V | 0.11V |
| | 3.59V~3.61V | 0.12V |
| | 3.52V~3.58V | 0.11V |
| | 3.51V OR BELOW | 0.12V |
| −10°C OR ABOVE | 3.59V OR ABOVE | 0.17V |
| | 3.51V~3.58V | 0.17V |
| | 3.46V~3.50V | 0.22V |
| | 3.31V~3.45V | 0.21V |
| | 3.30V OR BELOW | 0.27V |
| −11°C OR BELOW | 3.33V OR ABOVE | 0.28V |
| | 3.27V~3.32V | 0.28V |
| | 3.23V~3.26V | 0.26V |
| | 3.13V~3.22V | 0.19V |
| | 3.12V OR BELOW | 0.11V |

FIG.5

| NOTIFICATION LEVEL | TEMPERATURE-DEPENDENT THRESHOLD VALUES FOR BATTERY VOLTAGE | | | DISPLAY SYMBOL |
|---|---|---|---|---|
| | 6°C OR ABOVE | −10°C OR ABOVE | −11°C OR ABOVE | |
| 5 | 3.78V OR ABOVE | 3.76V OR ABOVE | 3.61V OR ABOVE | |
| 4 | 3.77V OR BELOW | 3.75V OR BELOW | 3.60V OR BELOW | |
| 3 | 3.73V OR BELOW | 3.72V OR BELOW | 3.52V OR BELOW | |
| 2 | 3.69V OR BELOW | 3.66V OR BELOW | 3.41V OR BELOW | |
| 1 | 3.63V OR BELOW | 3.57V OR BELOW | 3.23V OR BELOW | FLASHING |

BATTERY LEVEL INDICATOR FOR A TELEPHONE SET

This application is based on an application No. 11-278642 filed in Japan, the content of which is hereby incorporated by reference.

BACKGROUND OF THE INVENTION (1) Field of the Invention

The present invention relates to a technology for measuring the level of a battery used as a power source of a telephone set and for informing the user of this level.

(2) Description of the Prior Art

Most mobile phones are equipped with a battery level indicator. A battery level indicator measures the remaining charge (hereafter "level") of the battery used to power the phone and displays one of a plurality of notification levels, such as "high", "low" or "very low", on an LCD (Liquid Crystal Display) or other display means. On being informed of the present battery level in this way, the user can proceed to recharge the battery when necessary. As representative examples, lithium ion secondary cells, nickel hydroxide secondary cells and nickel-cadmium cells are used to power mobile phones.

Through microcomputer control, a battery level indicator samples the battery voltage at predetermined intervals and judges which of the notification levels corresponds to the average of the sampled voltages. The notification levels correspond to different ranges of voltages that are demarcated by threshold values. The judgment as to the appropriate notification level may be performed at 1.0-second intervals, while the average may be calculated for thirty sampled values that are obtained at 0.5-second intervals. An average value for the battery voltage is used to remove the effects of momentary fluctuations in battery voltage. Such fluctuations occur due to changes in the power consumed by the various transmission and reception circuits due to factors such as whether communication is taking place.

Assume that a mobile phone operates in one of two modes: standby mode and communication mode. When the mobile phone is investigated separately during standby mode and during communication mode, the current drawn from the battery can be seen to be low during standby mode but higher during communication mode. When a high current is drawn from the battery, there is a drop in the sampled battery voltage due to the internal resistance of the battery.

To remove the effects of the internal resistance of the battery and display the battery level correctly, the notification levels need to be associated with different voltage ranges (i.e. different threshold values need to be used) depending on whether the mobile phone is in standby mode or in communication mode.

FIG. 1 shows the threshold values for the sampled value of the battery voltage that are used for each notification level.

In the illustrated example, the battery level is shown as one of five notification levels.

In FIG. 1, different threshold values are also set for the same notification level depending on temperature. This drawing also shows the actual symbols used to display each notification level.

A conventional battery level indicator uses threshold values like those shown in FIG. 1 to determine which notification level corresponds to the average taken for the sampled battery voltages. The battery level indicator then has the corresponding notification level displayed on an LCD or the like.

A conventional battery level indicator considers any increase in the battery level that occurs when the battery is not being recharged to be unnatural, and is designed so that the notification level will not be switched to a higher battery level unless the battery is being recharged.

When determining the appropriate notification level, a conventional battery level indicator uses an average calculated for sampled values of the battery voltage. Unless special control is performed, there is the problem that a lower display value will be displayed immediately after the phone switches from communication mode to standby mode.

In more detail, when the mode switches in this way, the period during which the battery voltage is sampled will include both values measured during communication mode and values measured during standby mode. If the average of these values is compared with the threshold values used during standby mode, a lower display value will end up being displayed to the user.

This problem is caused by the sampled values measured during communication mode being lower than the sampled values measured during standby mode. This lowers the average of the sampled battery voltage. If this lowered average is compared with the thresholds used for determining the notification level in standby mode, the device will choose a notification level that represents a lower level than the actual level of the battery.

In a battery level indicator that is designed not to select a higher notification level unless the battery is being recharged, any switch that lowers the notification level cannot be reversed. This means that the notification level will continue to be displayed incorrectly, exacerbating the above problem.

The following describes one example of the above problem using specific values.

FIG. 2 shows the battery voltage before and after a mobile phone switches from communication mode to standby mode.

As shown in the drawing, the battery voltage is around 3.63V during communication mode and around 3.76V 10 seconds or so after the switch to standby mode. When five notification levels are provided for the case where the temperature is 6° C. or above, the battery level will be displayed as level 4 during communication mode and will remain at level 4 after some time has passed following the switch to standby mode.

However, immediately after the switch to standby mode, such as one second after, the average for the sampled values of the battery voltage that have been obtained in the preceding fifteen seconds is a low value, such as around 3.64V, due to the presence of values measured during communication mode. If the same criteria are used to determine the notification level, level 2 will be selected. As a result, the display value will switch from level 4 to level 2 after the end of the communication. When the limitation that prevents the notification level from switching to a higher level is operational, the notification level 2 will continue to be displayed until the battery is recharged.

SUMMARY OF THE INVENTION

In view of the stated problem, it is an object of the present invention to provide a battery level indicating apparatus that determines a notification level using an average for sampled values of the battery voltage, like a conventional apparatus, but does not mistakenly underestimate the battery level after a switch from communication mode to standby mode.

The stated object can be achieved by a battery level indicating apparatus for indicating a level of a battery, which powers a telephone having a communication mode and a standby mode, as one of a plurality of notification levels, the battery level indicating apparatus including: a threshold information storing unit for storing threshold information for specifying a notification level from a voltage of the battery during the standby mode; a measuring unit for measuring the voltage of the battery at intervals each equal to a first period to produce voltage measurements; a correcting unit for adding a correction value to each voltage measurement produced by the measuring unit during the communication mode to convert the voltage measurements to values equivalent to voltage measurements produced during standby mode; an average calculating unit for calculating, at intervals each equal to a second period, an average for the voltage of the battery from a predetermined number of most recent voltage measurements produced by the measuring unit, wherein voltage measurements produced during the standby mode are used without correction and voltage measurements produced during the communication mode are used having first been corrected by the correcting unit; a level determining unit for determining, every time the average calculating unit calculates the average, a notification level from the average in accordance with the threshold information; and an indicating unit for indicating the notification level determined by the level determining unit to a user of the telephone.

Here, the "predetermined number of most recent voltage measurements" that are averaged by the average calculating unit refers to the most recent measured values of the battery voltage with respect to the point at which the average is calculated.

With the stated construction, the voltage measurements produced during the communication mode are corrected. This means that when the predetermined number of voltage measurements used for calculating the average include both voltage measurements produced during the communication mode and voltage measurements produced during the standby mode, the notification level can still be properly determined from threshold values that determine voltage ranges for the standby mode. Correcting voltage measurements in this way removes the effects of the relatively low voltage measurements produced during the communication mode on the calculated average. This prevents the notification level from being determined at an erroneously low level, and so prevents an erroneously low level from being displayed to the user.

Here, the indicating unit may display a symbol showing the notification level determined by the level determining unit.

The stated construction prevents an inappropriate notification level from being shown to the user.

Here, the threshold information may specify a notification level based on a combination of a temperature of the battery and the voltage of the battery; the battery level indicating apparatus may further include a temperature detecting unit for detecting the temperature of the battery, the correcting unit may specify the correction value for a present voltage measurement according to the present voltage measurement and the temperature detected by the temperature detecting unit; and the level determining unit may refer to the threshold information and determine the notification level from the average and the temperature detected by the temperature detecting unit.

The stated construction can determine and display the battery level having taken into account the differences in discharge characteristics of the battery at different temperatures.

Here, the average calculating unit may calculate the average at all times except for a predetermined period following a switch by the telephone from communication mode to standby mode.

By operating as described above, the battery level indicating apparatus can remove the effects of the recovery period (see FIG. 2) for the battery voltage following a switch from communication mode to standby mode.

Here, the indicating unit may indicate the notification level determined by the level determining unit only when the determined notification level is equal to or lower than a notification level that is already being indicated by the indicating unit.

The stated construction prevents the battery level indicating apparatus from giving an unnatural display where the battery level rises.

The stated object of the present invention can also be achieved by a battery level indicating apparatus for indicating a level of a battery, which powers a telephone having a first mode and a second mode where different levels of current are drawn from the battery, as one of a plurality of discrete notification levels, the battery level indicating apparatus including: a threshold information storing unit for storing threshold information which is used for specifying a notification level from a voltage of the battery during the first mode; a measuring unit for measuring a voltage of the battery at intervals each equal to a first period to produce a voltage measurement; a correcting unit for correcting every voltage measurement produced by the measuring unit during the second mode by adding or subtracting a correction value to convert the voltage measurement to a value equivalent to a voltage measurement produced during the first mode; an average calculating unit for calculating, at intervals each equal to a second period, an average for the voltage of the battery from a predetermined number of most recent voltage measurements produced by the measuring unit, wherein voltage measurements produced during the first mode are used without correction and voltage measurements produced during the second mode are used having first been corrected by the correcting unit; a level determining unit for determining, every time the average calculating unit calculates the average, a notification level from the average in accordance with the threshold information; and an indicating unit for indicating the notification level determined by the level determining unit to a user of the telephone.

With the stated construction, the voltage measurements produced during the second mode are corrected. This means that when the predetermined number of voltage measurements used for calculating the average include both voltage measurements produced during the first mode and voltage measurements produced during the second mode, the notification level can still be properly determined from threshold values that determine voltage ranges for the first mode. This means that the notification level can be properly determined following a switch from the second mode to the first mode.

The stated object of the present invention can also be achieved by a battery level indicating apparatus for indicating a battery level of a battery, which powers a mobile phone having a communication mode and a standby mode, as one of a plurality of notification levels, the battery level indicating apparatus including: a memory for storing (1) a correction value table associating, for different temperature ranges, voltage values obtained during the communication mode with correction values for converting the voltage values obtained during the communication mode to values equivalent to voltage values obtained during the standby mode, and (2) a level table for specifying a notification level based on a combination of a temperature of the battery and the voltage of the battery; a temperature sensor for detecting the temperature of the battery; a measuring unit for measuring the voltage of the battery at intervals each equal to a first period to produce voltage measurements; a correcting unit for referring to the correction value table and specifying a correction value for each voltage measurement produced by the measuring unit during the communication mode based on the voltage measurement and the temperature detected by the temperature sensor, and adding the specified correction value to the voltage measurement; an average calculating unit for calculating, at intervals each equal to a second period, an average for the voltage of the battery from a predetermined number of most recent voltage measurements produced by the measuring unit, wherein voltage measurements produced during the standby mode are used without correction and voltage measurements produced during the communication mode are used having first been corrected by the correcting unit; a level determining unit for referring, every time the average calculating unit calculates the average, to the level table and determining a notification level using the calculated average and the temperature detected by the temperature sensor; and a liquid crystal display for displaying a symbol that represents the notification level determined by the level determining unit.

With the stated construction, the voltage of the battery that powers a mobile phone is measured and measurements made during the communication mode are corrected. This means that when voltage measurements used for calculating the average include both voltage measurements produced during the communication mode and voltage measurements produced during the standby mode, the notification level can still be properly determined from threshold values that determine voltage ranges for the standby mode. Correcting of voltage measurements in this way removes the effects of the relatively low voltage measurements produced during the communication mode on the calculated average. This prevents the notification level from being determined at an erroneously low level, and so prevents an erroneously low level from being displayed to the user.

BRIEF DESCRIPTION OF THE DRAWINGS

These and other objects, advantages and features of the invention will become apparent from the following description thereof taken in conjunction with the accompanying drawings which illustrate a specific embodiment of the invention.

In the Drawings:

FIG. 1 shows the threshold values for the sampled value of the battery voltage that are used for each notification level;

FIG. 2 shows the battery voltage before and after a mobile phone switches from communication mode to standby mode;

FIG. 3 is a functional block diagram showing a mobile phone 1000 including a battery level indicator 100 that is an embodiment of the present invention;

FIG. 4 shows the content of the correction value table stored in the correction value table storing unit 150;

FIG. 5 shows the content of the level table stored in the level table storing unit 122;

DESCRIPTION OF THE PREFERRED EMBODIMENT

Figure 6:
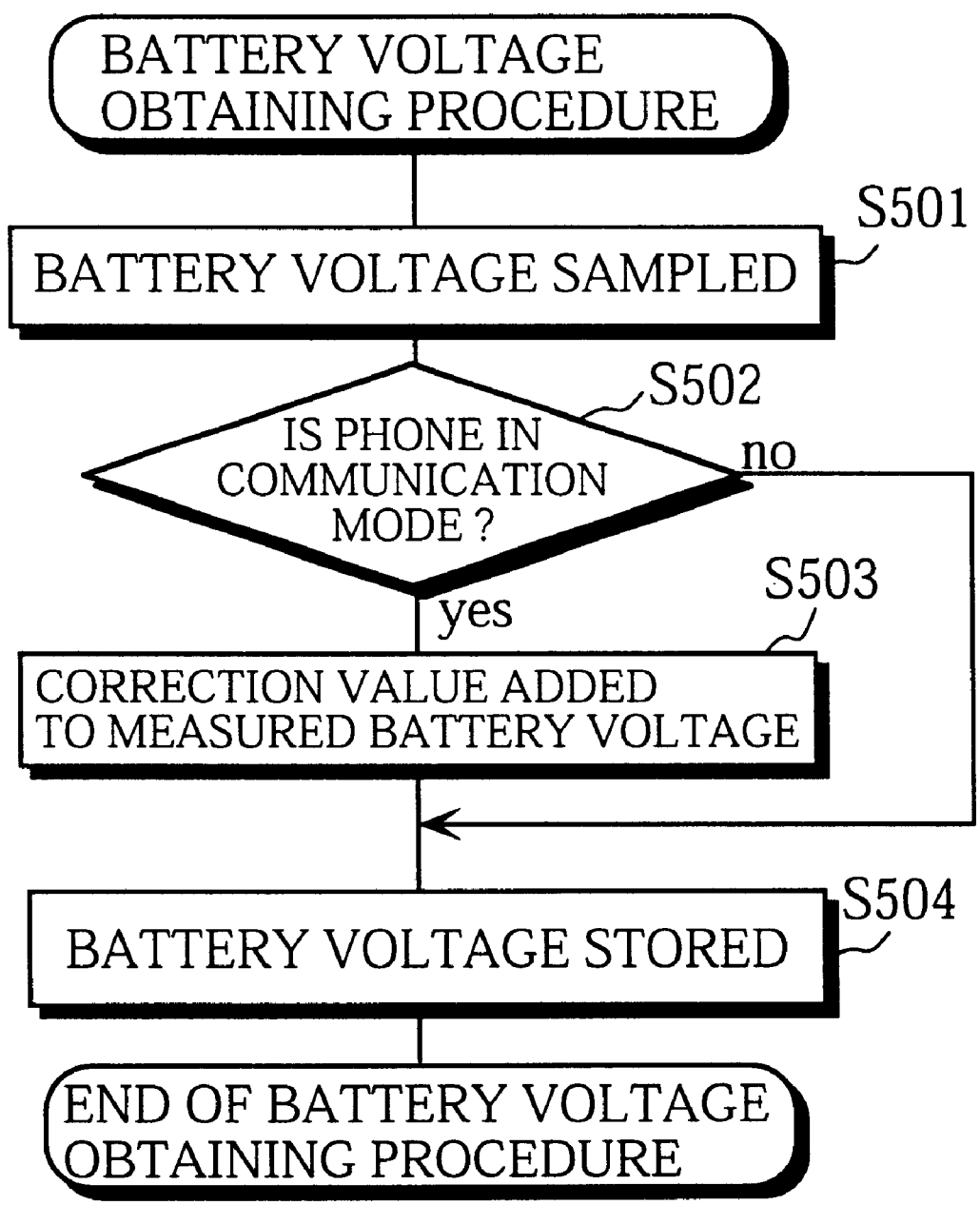
FIG. 6 is a flowchart showing the battery voltage obtaining procedure.

The following describes a battery level indicator hat is an embodiment of the present invention, with reference to the attached FIGS.

Construction

FIG. 3 is a functional block diagram showing a mobile phone 1000 including a battery level indicator 100 that is an embodiment of the present invention.

The mobile phone 1000 performs communication according to a time division multiplexing method. When the power is on, the mobile phone 1000 operates in either standby mode or communication mode. As shown in FIG. 3, the mobile phone 1000 includes transmission/reception circuitry 200, a mode control unit 300, a battery 10, and a battery level indicator 100. In the present example, the battery 10 is a lithium ion secondary cell that powers the mobile phone 1000.

The transmission/reception circuitry 200 compresses and encodes an audio signal inputted via a microphone, subjects the result to modulation and other processes, and transmits the resulting radio signals via an antenna. In addition, the transmission/reception circuitry 200 demodulates radio signals received via the antenna, performs decoding and other processes to obtain an audio signal, and outputs this signal as audio via a speaker.

In accordance with user operations, the mode control unit 300 switches the mobile phone 1000 between standby mode and communication mode. This function of the mode control unit 300 is realized by a microcomputer. The mode control unit 300 also controls the operation of the transmission/reception circuitry 200. During communication mode, the user can hold a telephone conversation using the speaker and microphone mentioned above.

The battery level indicator 100 includes an LCD 110, a level determining unit 120, a battery voltage measuring unit 130, a correction unit 140, a correction value table storing unit 150, and a temperature sensor 160.

The LCD 110 displays a display symbol to show the present battery level.

The battery voltage measuring unit 130 subjects the voltage of the battery 10 to A/D conversion and compares the result with a predetermined reference voltage obtained using a voltage regulator or the like. The battery voltage is sampled in this way every 0.5 seconds and the resulting value is supplied to the correction unit 140. This sampling is performed to an accuracy of 0.01V.

The correction value table storing unit 150 is a memory region that stores a correction value table. This correction value table is described later in this specification.

The temperature sensor 160 detects the temperature of the battery 10.

The correction unit 140 operates as follows. When the battery voltage is sampled by the battery voltage measuring unit 130 during communication mode, the correction unit 140 refers to the correction value table stored in the correction value table storing unit 150 and adds an appropriate correction value for the temperature value obtained by the temperature sensor 160. The correction unit 140 stores the values for the battery voltage sampled during communication mode after correcting them in this way. Conversely, the correction unit 140 stores the values for the battery voltage sampled during and by mode without correcting them. In this embodiment, the thirty most recent samples of the battery voltage are stored.

The level determining unit 120 includes an average calculating unit 121, a level table storing unit 122, and a present level storing unit 123. The level determining unit 120 has the average calculating unit 121 calculate the average for the sampled values and determines the notification level based on the calculated average and the level table. The level determining unit 120 then has a suitable symbol for the determined notification level displayed on the LCD 110.

In more detail, the average calculating unit 121 obtains thirty samples for the battery voltage that have been processed by the correction unit 140 and calculates an average for these values.

The level table storing unit 122 is a memory region that stores a level table. This level table is described in detail later in this specification.

The present level storing unit 123 is a memory region that stores the present notification level that is being represented on the LCD 110.

The functions of the level determining unit 120, the correction unit 140 and the correction value table storing unit 150 are all realized by a microcomputer that is equipped with a memory. In more detail, the functions of these elements are realized by the microcomputer executing a control program stored in the memory, or simply by the memory itself.

Data Construction

The following describes the correction value table stored in the correction value table storing unit 150 and the level table stored in the level table storing unit 122.

FIG. 4 shows the content of the correction value table stored in the correction value table storing unit 150.

As shown in the drawing, the correction value table associates ranges of measured values of the battery voltage with correction values that are provided separately for different temperature ranges.

As examples, when the temperature is 6° C. or above, the correction value 0.11V is used for measured values of the battery voltage that are 3.67V or above, while the correction value 0.12V is used for measured values of the battery voltage that are no less than 3.59V but no greater than 3.61V.

As mentioned above, these correction values are used to convert values of the battery voltage measured during communication mode to values that are equivalent to volatage values measured during standby mode. This conversion is performed by adding a correction value to a measured value. As described later, the notification level is determined using a level table that does not distinguish between standby mode and communication mode. As a result, the values of the battery voltage used to calculate the average need to have been measured during standby mode or to have been converted to values that are equivalent to voltage values measured during standby mode. This conversion is performed using the correction values described above.

FIG. 5 shows the content of the level table stored in the level table storing unit 122.

As shown in FIG. 5, the level table associates notification levels with ranges demarcated by threshold values for the battery voltage and different temperature ranges. The level table also shows the display symbol that is displayed on the LCD 110 to indicate each notification level to the user.

Five notification levels numbered 1 to 5 are available. Notification level 5 represents the highest battery level, while notification level 1 shows that the battery level is extremely low. These notification levels are determined based on discharging characteristics that are standardized for the battery voltage during standby mode (see FIG. 1).

As examples, when the temperature is 6° C. or above, notification level 5 is used when the average value of the battery voltage is 3.78V or above, notification level 4 is used when the average value of the battery voltage is no less than 3.74V but no greater than 3.77V, notification level 3 is used when the average value of the battery voltage is no less than 3.70V but no greater than 3.73V, notification level 2 is used when the average value of the battery voltage is no less than 3.64V but no greater than 3.69V, and notification level 1 is used when the average value of the battery voltage is 3.63V or less.

The level determining unit 120 has the following display symbols displayed on the LCD 110 to inform the user of the present battery level. Each display symbol is shaped like a battery. When the notification level is five, three blocks are shown inside the battery shape. When the notification level is four, two blocks are shown inside the battery shape. When the notification level is three, one block is shown inside the battery shape. When the notification level is two, only the battery shape is displayed. When the notification level is one, the display symbol has the same shape as the display symbol for the notification level two, though the display symbol flashes on the display.

Operation

The following describes the operation of the battery level indicator 100 provided in the mobile phone 1000 with the construction described above. The description splits the operation into a battery voltage obtaining procedure and a battery level display procedure.

The battery voltage obtaining procedure is described first.

FIG. 6 is a flowchart showing the battery voltage obtaining procedure.

The battery level indicator 100 repeatedly executes the procedure shown in FIG. 6 at 0.5-second intervals.

The battery voltage measuring unit 130 measures the battery voltage of the battery 10 and transfers the measured battery voltage value to the correction unit 140 (step S501).

On receiving a measured battery voltage value, the correction unit 140 asks the mode control unit 300 whether the mobile phone 1000 is in standby mode or in communication mode (step S502). When the mobile phone 1000 is in communication mode, the correction unit 140 adds a correction value to the measured battery voltage value (step S503), and stores the corrected battery voltage value in the memory (step S504).

In more detail, in step S503 the correction unit 140 refers to the correction value table stored in the correction value table storing unit 150, specifies the suitable correction value for the temperature value obtained from the temperature sensor 160 and the battery voltage value obtained from the battery voltage measuring unit 130, and adds the specified correction value to the battery voltage value.

When, in step S502, the mode control unit 300 informs the correction unit 140 that the mobile phone 1000 is in standby mode, the correction unit 140 skips step S503 and stores the battery voltage value received from the battery voltage measuring unit 130 in the memory without adding a correction value (step S504).

Note that the memory used to store the battery voltage values in step S504 is a memory region that is capable of storing thirty battery voltage values in a cyclical manner. As a result, the thirty most recent battery voltage values are stored in this memory region.

The following describes the battery level display procedure.

Figure 7:
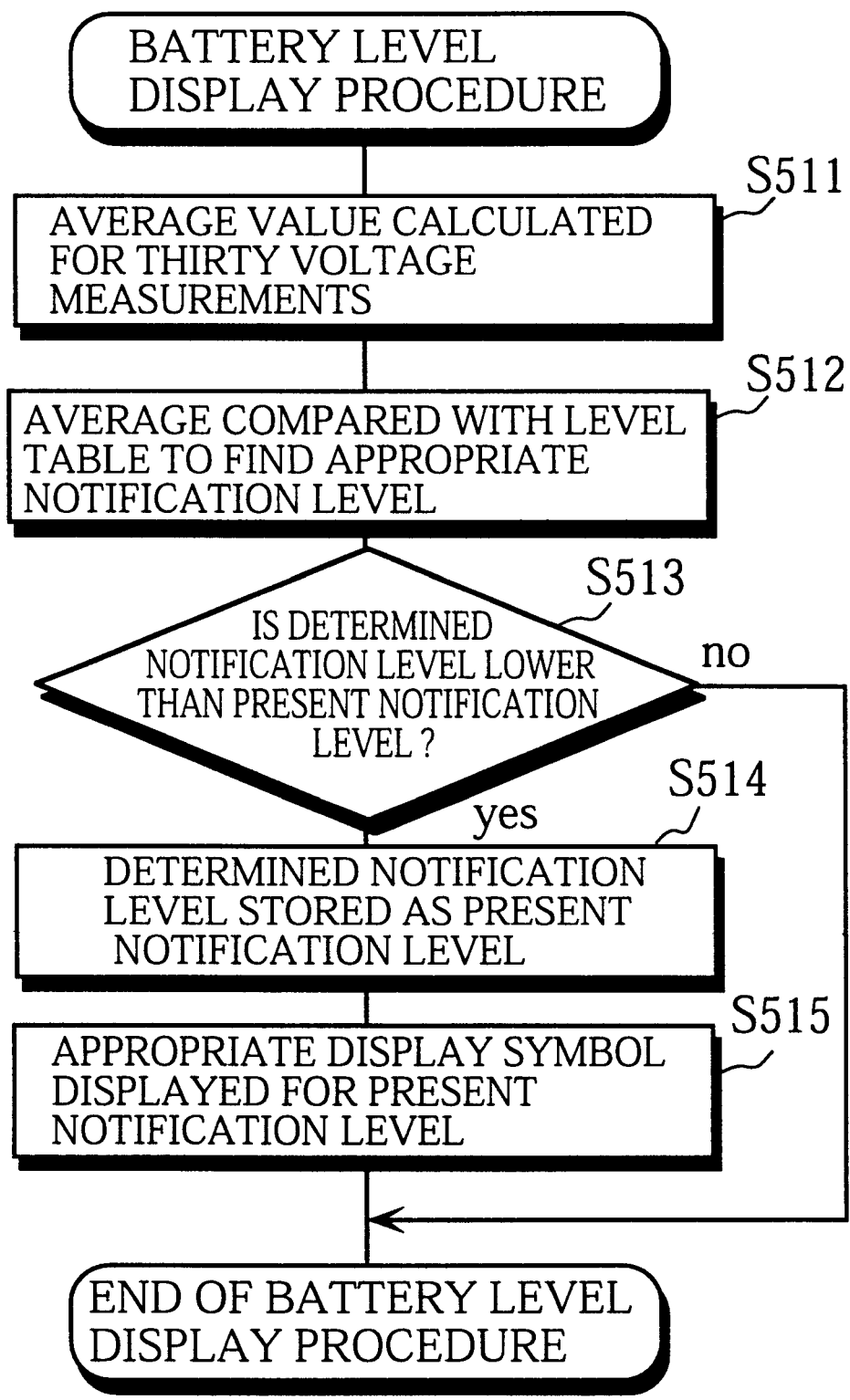
FIG. 7 is a flowchart showing the battery level display procedure.

FIG. 7 is a flowchart showing the battery level display procedure.

The battery level indicator 100 repeatedly executes the procedure shown in FIG. 7 with intervals of 1.0 seconds to update the displayed battery level as necessary.

The average calculating unit 121 of the level determining unit 120 obtains thirty battery voltage values that have been stored in the memory by the correction unit 140 and calculates an average for these battery voltage values (step S511).

Once the average calculating unit 121 has calculated the average, the level determining unit 120 refers to the level table stored in the level table storing unit 122 and determines the appropriate notification level for the calculated average and the temperature obtained from the temperature sensor 160 (step S512).

After determining the notification level, the level determining unit 120 compares the determined notification level with the present notification level stored in the present level storing unit 123 (step S513). When the determined notification level is lower than the present notification level, the level determining unit 120 stores the determined notification level in the present level storing unit 123 as the present notification level (step S514), and displays the appropriate display symbol for this notification level on the LCD 110 (step S515).

When, in step S513, the determined notification level is equal to or higher than the present notification level, the level determining unit 120 omits the processing in steps S514 and S515.

Considerations

The following describes how by operating as described above, the battery level indicator 100 of the present embodiment overcomes the stated problem of the displayed battery level decreasing immediately after the mobile phone switches from communication mode to standby mode.

Assuming that the temperature is 6° C. or above, when, as shown in FIG. 2, the battery voltage in communication mode is around 3.63V, the correction unit 140 adds the correction value 0.11V (see FIG. 4) to the battery voltage value measured by the battery voltage measuring unit 130. As a result, the battery voltage value used for the comparison is around 3.74V, so that the level 4 is determined as the notification level in communication mode (see FIG. 5).

If the notification level is determined one second, for example, after the mobile phone 1000 switches to standby mode, the average for twenty-eight values that are around 3.74V and two values that are around 3.71V will be around 3.74V, so that the level determining unit 120 will determine that the notification level is level 4 (see FIG. 5).

As described in the related art section, the level determination by a conventional device for the same figures results in a switch from level 4 to an inappropriate notification level such as level 2. This means that the battery level indicator 100 solves the problem of the displayed battery level decreasing inappropriately when a mobile phone switches from communication mode to standby mode.

Modifications

The battery level indicator of the present invention has been described by means of the above embodiment, though it should be obvious that the present invention is not limited to the details given therein. Several modifications are possible, with representative examples being given below.

(1) The battery level indicator described in the embodiment displays the battery level of a battery used in a mobile phone that communicates using time-division multiplexing. The battery level indicator may also be used in a mobile phone that communicates using another method, such as Code-Division Multiple Access (CDMA), or in a PHS (Personal Handyphone System) telephone.

The mobile phone of the above embodiment is described as using a lithium ion rechargeable cell as its battery, though this is not a limitation for the present invention. Other types of battery may be used.

(2) The above embodiment states that the battery voltage is sampled at 0.5-second intervals and that the notification level for the battery is determined at 1.0-second intervals, though neither of these is a limitation for the present invention. However, if the interval between judgements of the notification levels becomes long relative to the sampling period during which the battery voltage values are obtained (described as being the fifteen seconds during which thirty samples are taken at 0.5-second intervals), the following problem may occur. A recovery period exists immediately after the mobile phone switches from communication mode to standby mode, during which the battery voltage is lower than it is in standby mode (see FIG. 2). The effects of the battery voltage values measured during this recovery period can result in a slight error in the determination of the notification level.

Note that the determination of the notification level, including the calculation of the average battery voltage, may be omitted for a period, such as fifteen seconds, that follows the switch from communication mode to standby mode. This nullifies the effects of the recovery period (see FIG. 2) for the battery voltage following a switch from communication mode to standby mode. With the exception of the case where the mobile phone frequently switches from communication mode to standby mode, which is to say, during normal operational conditions, this enables the correct battery level to be displayed.

(3) The above embodiment is described as not updating the present notification level unless the determined notification level is lower than the present notification level (see FIG. 7, step S513). When the battery is being recharged, however, the processing in step S514 onwards may be performed with the judgement in step S513 being omitted. When the battery is not being recharged, the notification level may be updated even when the determined notification level is higher than the present notification level. However, this may lead to a display symbol for a higher battery level being displayed in spite of the battery not being charged.

(4) The above embodiment describes the case where the battery level is judged using a level table that includes sets of threshold values for battery voltage values measured during standby mode. As an alternative, the level table may be composed of threshold values for battery voltage values measured during communication mode, with the battery voltage values sampled during standby mode being converted to equivalent values by subtracting correction values. These converted values are then compared with the values in the level table to determine the appropriate notification level.

(5) In the above embodiment, the battery level indicator has a display symbol displayed on the LCD 110 to inform the user of the battery level. However, the battery level may be displayed using LEDs (light emitting diodes) or any other kind of display apparatus. Also, instead of displaying a symbol, the battery level indicator may inform the user of the battery level by another means, such as by outputting a sound or vibrating the case of the mobile phone. When the battery level is indicated through sound output, different battery levels can be indicated using different volumes or different pitches. In other words, the battery level indicator of the present invention can use any method that informs the user, through the user's five senses, of the determined notification level of the battery.

Although the present invention has been fully described by way of examples with reference to accompanying drawings, it is to be noted that various changes and modifications will be apparent to those skilled in the art. Therefore, unless such changes and modifications depart from the scope of the present invention, they should be construed as being included therein.

What is claimed is:

1. A battery level indicating apparatus for indicating a level of a battery, which powers a telephone having a communication mode and a standby mode, as one of a plurality of notification levels, the battery level indicating apparatus comprising:

threshold information storing means for storing threshold information for specifying a notification level from a voltage of the battery during the standby mode;

measuring means for measuring the voltage of the battery at intervals each equal to a first period to produce voltage measurements;

correcting means for adding a correction value to each voltage measurement produced by the measuring means during the communication mode to convert the voltage measurements to values equivalent to voltage measurements produced during standby mode;

average calculating means for calculating, at intervals each equal to a second period, an average for the voltage of the battery from a predetermined number of most recent voltage measurements produced by the measuring means, wherein voltage measurements produced during the standby mode are used without correction and voltage measurements produced during the communication mode are used having first been corrected by the correcting means;

level determining means for determining, every time the average calculating means calculates the average, a notification level from the average in accordance with the threshold information; and indicating means for indicating the notification level determined by the level determining means to a user of the telephone.

2. A battery level indicating apparatus in accordance with claim 1, wherein the indicating means displays a symbol showing the notification level determined by the level determining means.

3. A battery level indicating apparatus in accordance with claim 2, wherein the threshold information specifies a notification level based on a combination of a temperature of the battery and the voltage of the battery;

the battery level indicating apparatus further comprising temperature detecting means for detecting the temperature of the battery, wherein the correcting means specifies the correction value for a present voltage measurement according to the present voltage measurement and the temperature detected by the temperature detecting means; and the level determining means refers to the threshold information and determines the notification level from the average and the temperature detected by the temperature detecting means.

4. A battery level indicating apparatus in accordance with claim 3, wherein the average calculating means calculates the average at all times except for a predetermined period following a switch by the telephone from communication mode to standby mode.

5. A battery level indicating apparatus in accordance with claim 4, wherein the indicating means displays a symbol showing the notification level determined by the level determining means only when the determined notification level is equal to or lower than a notification level represented by the symbol that is already being displayed by the indicating means.

6. A battery level indicating apparatus in accordance with claim 1, wherein the average calculating means calculates the average at all times except for a predetermined period following a switch by the telephone from communication mode to standby mode.

7. A battery level indicating apparatus in accordance with claim 1, wherein the indicating means indicates the notification level determined by the level determining means only when the determined notification level is equal to or lower than a notification level that is already being indicated by the indicating means.

8. A battery level indicating apparatus for indicating a level of a battery, which powers a telephone having a first mode and a second mode where different levels of current are drawn from the battery, as one of a plurality of discrete notification levels, the battery level indicating apparatus comprising:

threshold information storing means for storing threshold information which is used for specifying a notification level from a voltage of the battery during the first mode;

measuring means for measuring a voltage of the battery at intervals each equal to a first period to produce a voltage measurement;

correcting means for correcting every voltage measurement produced by the measuring means during the second mode by adding or subtracting a correction value to convert the voltage measurement to a value equivalent to a voltage measurement produced during the first mode;

average calculating means for calculating, at intervals each equal to a second period, an average for the voltage of the battery from a predetermined number of most recent voltage measurements produced by the measuring means, wherein voltage measurements produced during the first mode are used without correction and voltage measurements produced during the second mode are used having first been corrected by the correcting means;

level determining means for determining, every time the average calculating means calculates the average, a notification level from the average in accordance with the threshold information; and indicating means for indicating the notification level determined by the level determining means to a user of the telephone.

9. A battery level indicating apparatus in accordance with claim 8, wherein the indicating means displays a symbol showing the notification level determined by the level determining means.

10. A battery level indicating apparatus in accordance with claim 8, wherein the threshold information specifies a notification level based on a combination of a temperature of the battery and the voltage of the battery;

the battery level indicating apparatus further comprising temperature detecting means for detecting the temperature of the battery, wherein the correcting means specifies the correction value to be added to or subtracted from a voltage measurement produced during the second mode according to (1) the present voltage measurement and (2) the temperature detected by the temperature detecting means; and the level determining means refers to the threshold information and determines the notification level from the average and the temperature detected by the temperature detecting means.

11. A battery level indicating apparatus in accordance with claim 8, wherein the indicating means displays the notification level determined by the level determining means only when the determined notification level is equal to or lower than a notification level that is already being displayed by the indicating means.

12. A battery level indicating apparatus for indicating a battery level of a battery, which powers a mobile phone having a communication mode and a standby mode, as one of a plurality of notification levels, the battery level indicating apparatus comprising:

a memory for storing
(1) a correction value table associating, for different temperature ranges, voltage values obtained during the communication mode with correction values for converting the voltage values obtained during the communication mode to values equivalent to voltage values obtained during the standby mode, and
(2) a level table for specifying a notification level based on a combination of a temperature of the battery and the voltage of the battery;

a temperature sensor for detecting the temperature of the battery;

measuring means for measuring the voltage of the battery at intervals each equal to a first period to produce voltage measurements;

correcting means for referring to the correction value table and specifying a correction value for each voltage measurement produced by the measuring means during the communication mode based on the voltage measurement and the temperature detected by the temperature sensor, and adding the specified correction value to the voltage measurement;

average calculating means for calculating, at intervals each equal to a second period, an average for the voltage of the battery from a predetermined number of most recent voltage measurements produced by the measuring means, wherein voltage measurements produced during the standby mode are used without correction and voltage measurements produced during the communication mode are used having first been corrected by the correcting means;

level determining means for referring, every time the average calculating means calculates the average, to the level table and determining a notification level using the calculated average and the temperature detected by the temperature sensor; and a liquid crystal display for displaying a symbol that represents the notification level determined by the level determining means.

* * * * *